United States Patent [19]
Kawaguchi

[11] Patent Number: 5,420,691
[45] Date of Patent: May 30, 1995

[54] ELECTRIC COMPONENT OBSERVATION SYSTEM

[75] Inventor: Shintaro Kawaguchi, Fukuoka, Japan

[73] Assignee: Matsushita Electric Industrial Co., Ltd., Osaka, Japan

[21] Appl. No.: 185,165

[22] Filed: Jan. 24, 1994

Related U.S. Application Data

[63] Continuation of Ser. No. 851,637, Mar. 16, 1992, abandoned.

[30] Foreign Application Priority Data

Mar. 15, 1991 [JP] Japan ................... 3-051028
Jun. 18, 1991 [JP] Japan ................... 3-145835

[51] Int. Cl.⁶ ......................................... G01B 11/00
[52] U.S. Cl. ........................ 356/375; 29/721; 29/759; 348/87
[58] Field of Search ............... 356/237, 376, 394, 375, 356/398; 73/104, 800, 865.8; 348/187, 189, 87, 126; 29/720, 721, 729, 739, 740, 741, 742, 759, 760, 761, 833, 840; 364/488-491

[56] References Cited

U.S. PATENT DOCUMENTS

| | | | |
|---|---|---|---|
| 4,130,852 | 12/1978 | Peffer et al. | 250/325 |
| 4,628,464 | 12/1986 | McConnell | 356/375 |
| 4,793,707 | 12/1988 | Hata et al. | 356/375 |
| 4,803,871 | 2/1989 | Harada et al. | 356/376 |
| 4,812,666 | 3/1989 | Wistrand | 250/561 |
| 4,872,052 | 10/1989 | Liudzius et al. | 356/237 |
| 5,131,753 | 7/1992 | Pine et al. | 356/376 |

*Primary Examiner*—Hoa Q. Pham
*Attorney, Agent, or Firm*—Pollock, Vande Sande & Priddy

[57] ABSTRACT

An electronic component observation system includes a transparent stage for supporting thereon an electronic component which is being held by a vacuum nozzle of a transfer head, a lighting unit for illuminating outer leads of the electronic component from the above, and a camera for observing the outer leads from the underside of the transparent stage. When the electronic component being held by the vacuum nozzle is placed on the state, a deformation the outer leads is rectified. The lighting unit may include a presser portion engageable with the outer leads to force the outer leads against the stage, thereby positively shaping the outer leads into a correct form.

17 Claims, 5 Drawing Sheets

ELECTRIC COMPONENT OBSERVATION SYSTEM

This application is a continuation of Ser. No. 07/851,637, filed on Mar. 16, 1992, now abandoned.

BACKGROUND OF THE INVENTION

1. Field of the Invention

The present invention relates to an apparatus for observing electronic components, and more particularly to an electronic component observation system for observing outer leads of a semiconductor device in the process of assembling the semiconductor device.

2. Description of the Prior Art

In a conventional semiconductor-device fabrication technique generally known as the "tape automated bonding method", semiconductor chips are bonded in succession to a film carrier of synthetic resin such as polyimide, and after that the film carrier is stamped at predetermined intervals by a punching machine, thereby fabricating semiconductor devices. The semiconductor devices thus fabricated are then bonded to a substrate. The bonding process of this kind is called the "outer lead bonding". In a modern outer lead bonding, a number of very fine outer leads projecting from a semiconductor chip with a very narrow inter-lead space or pitch are aligned with, and then bonded to, a corresponding number of very fine electrodes formed on the substrate with a very fine pitch.

However, since the film carrier is generally stored in the form of a roll wound on a spool or reel, it has a tendency to curl up when unwound from the reel. Due to the curling tendency of the film carrier, the outer leads formed by stamping from the same film carrier are necessarily curved or otherwise deformed to some extent.

On the other hand, a process for bonding semiconductor chips to a film carrier is generally known as "inner bonding". In the inner bonding, inner leads on the film carrier are attached by thermocompression bonding to an electrode portion formed on a surface of each semiconductor chip. During the thermocompression bonding, the inner leads are liable to thermal deformation.

For the reasons described above, in the outer lead bonding of semiconductor devices using a film carrier, deformation of the outer leads is inevitable. As a consequence of the deformation, the outer leads must be observed by a camera, for example, in order to detect the arrangement and position of the outer leads accurately before the semiconductor device is mounted on a substrate.

Figure 6:
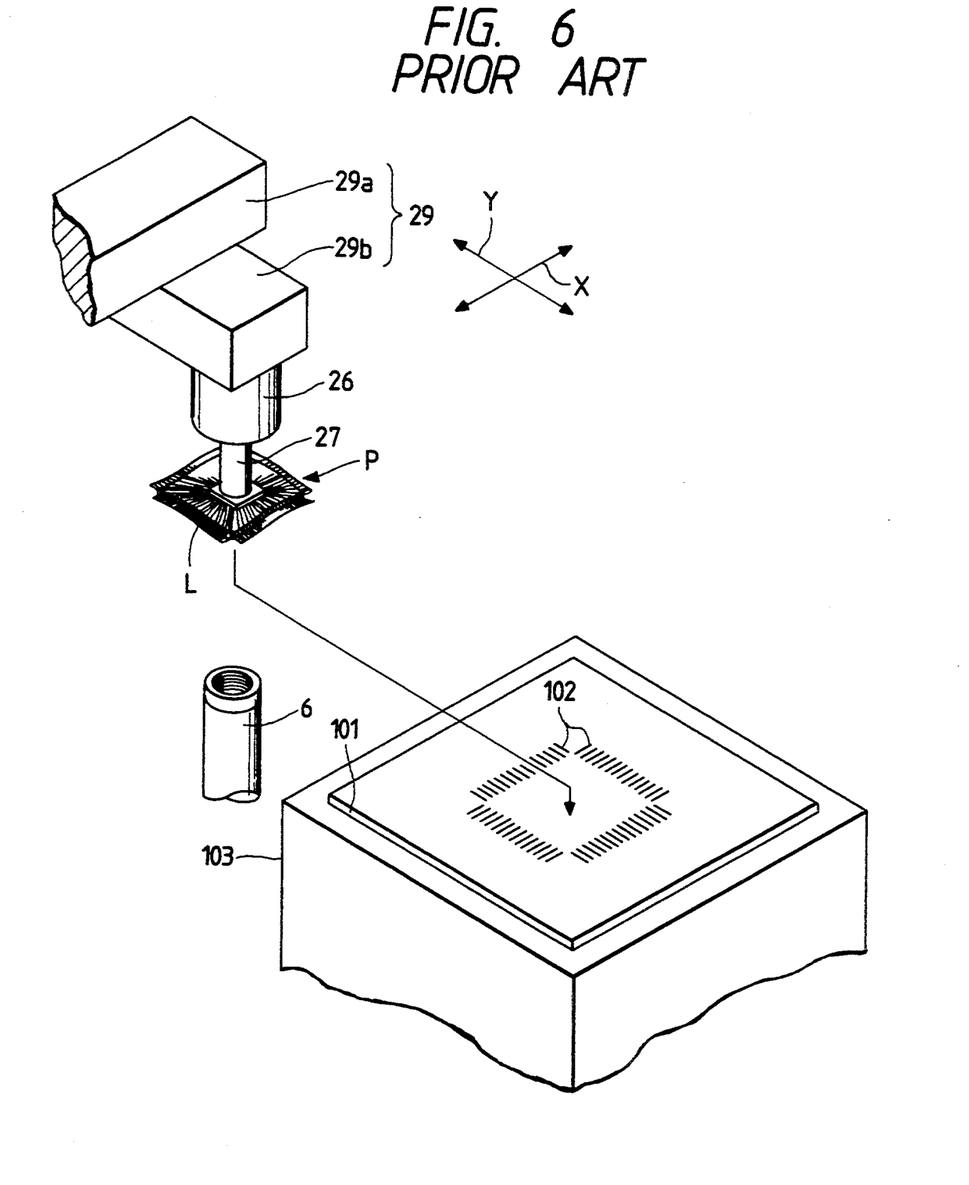
FIG. 6 is a schematic perspective view of a conventional electronic component observation system.

FIG. 6 illustrates a conventional electronic component observation system which includes a transfer head 26 mounted on an X-Y table 29 composed of an X-table 29a and a Y-table 29b. The X-table 29a and the Y-table 29b are movable in horizontal planes in the directions perpendicular to each other. A vacuum nozzle 27 extends vertically from a lower end of the transfer head 26 and has, at its lower end, a suction hole communicating with a vacuum source such as a suction pump (not shown). A semiconductor device P is held by the vacuum nozzle 27 at a position directly above a camera 6. In this condition, the outer leads L of the electronic component P are observed by the camera 6 and the arrangement and position of the outer leads L are detected.

Due to the curing tendency of a base film carrier, the outer leads L are generally curved or otherwise deformed to some extent ad described above, so that an accurate detection of the arrangement and position of the outer leads are substantially impossible. Accordingly, if the electronic component P were mounted on a substrate 101 carried on a table 103 based on the result of such inaccurate observation, misalignment or mismatching between the outer leads L and electrodes 102 on the substrate 101 would result.

SUMMARY OF THE INVENTION

With the foregoing drawbacks of the prior art in view, it is an object of the present invention to provide an electronic component observation system which is capable of observing outer leads of the electronic components with high accuracy and rectifying the shape of the outer leads.

According to the present invention, there is provided an electronic component observation system which comprises a stage for supporting thereon an electronic component having a plurality of outer leads, a movable transfer head, drive means for moving the transfer head, a vacuum nozzle associated with the transfer head for releasably holding thereon the electronic component by a suction force, an observation unit for observing the outer leads of the electronic components, and a lighting unit for illuminating the outer leads of the electronic components. The stage, transfer head, vacuum nozzle, observation unit and lighting unit are arranged in such a relation that when the transfer head places the electronic component on the stage with the electronic components held by the vacuum nozzle, the lighting unit emits a beam of light onto the outer leads of the electronic components, and the observing unit observes the outer leads of the electronic components.

The stage is transparent, and lighting unit comprises at least one light projector disposed above the transparent state for illuminating the outer leads of the electronic component from an upper side thereof. The observation unit is a camera disposed below the transparent stage for observing the outer leads from the underside of the transparent stage.

According to preferred embodiment, the lighting unit is composed of a pair of light projectors pivotally movable about a pair of horizontal axes, respectively. Each of the light projectors has an internal light path having an open end from which the light beam is projected, and a presser portion extending around the open end of the internal light path. The presser portion, in response to pivotal movement of each of the light projectors, is engageable with a portion of the outer leads to force the outer lead portion against the stage.

Preferably, the transfer head is movable in either or both of horizontal and vertical directions, the stage is movable in a horizontal direction, and the observation unit is movable in horizontal and vertical directions. The observation unit is mounted on an X-Y table.

The lighting unit may include at least one light projector, a light source, and an optical fiber interconnecting the light source and the light projector.

The observation system may further include a static eliminator for removing static electricity from the stage. Preferably, the static eliminator comprises an ion source for producing gas irons, a tube, and at least one spout connected by the tube to the ion source and disposed adjacent to the state for emitting the gas irons onto the stage.

The above and other objects, features and advantages of the present invention will become more apparent from the following description when making reference to the detailed description and the accompanying sheets of drawings in which a preferred structural embodiment incorporating the principles of the present invention is shown by way of illustrative example.

DETAILED DESCRIPTION OF THE INVENTION

Figure 1:
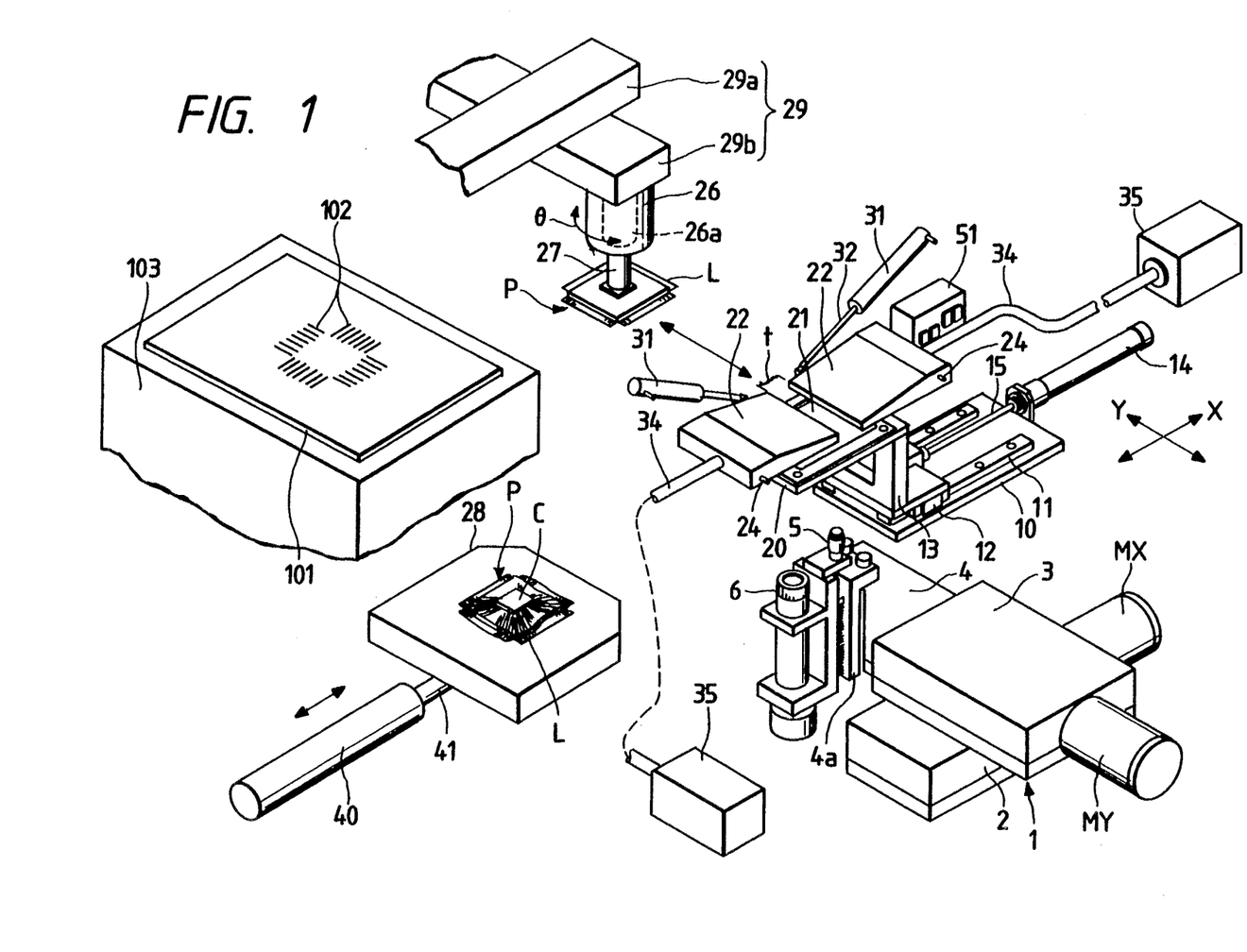
FIG. 1 is a diagrammatical perspective view of an electronic component observation system according to the present invention.

The present invention will be described hereinbelow in greater detail with reference to a preferred embodiment shown in FIGS. 1 through 5. FIG. 1 shows the general construction of an electronic component observation system according to the present invention. The observation system includes a first X-Y table 1 composed of an X-table 2 movable in the direction of X in a horizontal plane, and a Y-table 3 movable in a horizontal plane in the direction of Y which is perpendicular to the X direction. The X-table 2 is driven by a first drive means or unit MX, while the Y-table 3 is driven by a second drive means or unit MY. The X-Y table 1 has a horizontal first support plate 4.

The first support plate 4 is provided with a vertical holder member 4a on which a micrometer 5 and an observation unit comprised of a camera 6 are mounted in a vertical disposition. The micrometer 5 is provided to adjust the focal point of the camera 6 via a gear mechanism (not shown). By actuating the micrometer 5, the camera 6 is movable in a vertical direction. The camera 6 is also movable in a horizontal direction in response to the movement of the X-Y table 1 in the X and Y directions.

A horizontal table 10 is spaced upwardly from the X-Y table 1 and has on its upper surface a pair of parallel spaced guide rails 11. The guide rails 11 extend in a direction parallel to the X direction and, hence, they are known as the X-rails. The X-rails 11 slidably support thereon a slider 12. The slider 12 has an upper surface to which a horizontal portion of an L-shaped bracket 13 is attached. The L-shaped bracket 13 supports thereon a horizontal landing stage 20 projecting from an upper end of a vertical portion of the L-shaped bracket 13. The bracket 13 is connected to one end of a-piston rod 15. The piston rod 15 extends parallel to the X-rails 11 and is connected at an opposite end to a piston (not shown) of a first cylinder actuator 14 secured to the support table 10. In response to reciprocating movement of the piston rod 15, the landing stage 20 is movable horizontally in the X direction between an advanced position in which the landing stage 20 is vertically aligned with the camera 6, and a retracted position remote from the advanced position. The landing stage 20 is normally disposed in the retracted position.

Figure 2:
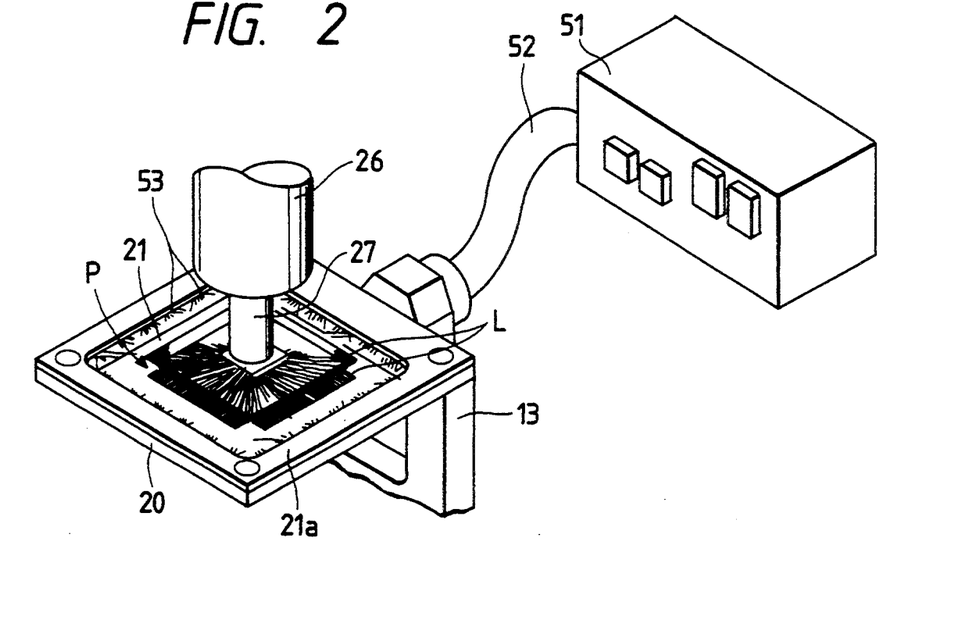
FIG. 2 is a perspective view of a static eliminator of the electronic component observation system.

The landing stage 20 is made of a transparent material such as glass. A substantially square hollow frame 21a is attached to an upper surface of the landing stage 20 so as to define therebetween a substantially square, depressed transparent platform 21, as shown in FIG. 2. The platform 21 has a horizontal area large enough to receive an electronic component P.

As shown in FIG. 2, the hollow frame 21a of the landing stage 20 has a plurality of spouts 53 arranged along an inner peripheral wall thereof. The spouts 53 are connected via a tube 52 with an ion source or generator 51 in which gas ions are produced, focused, accelerated and emitted as a narrow beam. When the ion source 51 is operating, the gas ions produced in the ion source 51 are emitted from the spouts 53 against an upper surface of the platform 21 and thereby remove or erase static electricity on the platform 21. Thus, the ion source 51 serves as a static eliminator. With this static eliminator, the platform 21 is free from static electricity and hence any foreign matter such as dust particles cannot adhere to the platform 21 and also to outer leads L of a semiconductor device P placed on the platform 21. The ion source 51 may be replaced by any other suitable static eliminator such as a conductive brush held in contact with the platform 21.

Figure 3:
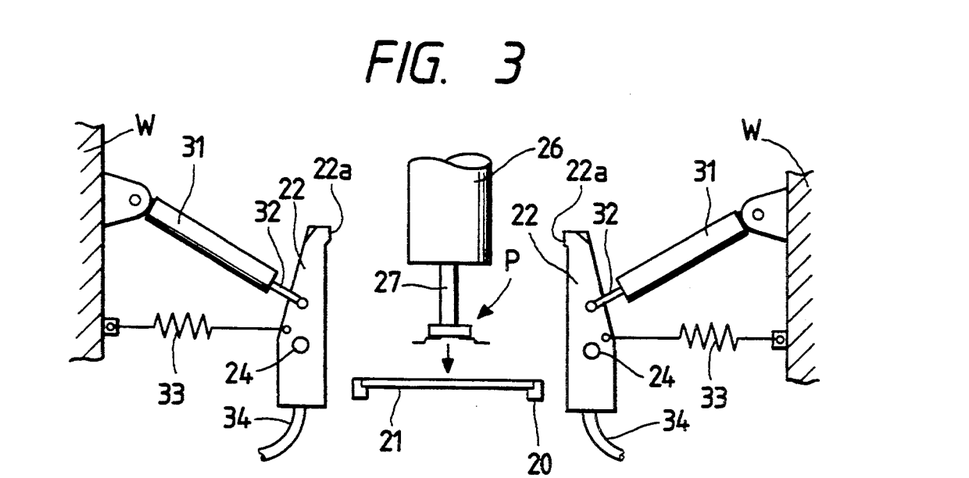
FIG. 3 is a diagrammatical side view of a lighting unit of the observation system.
Figure 4A:
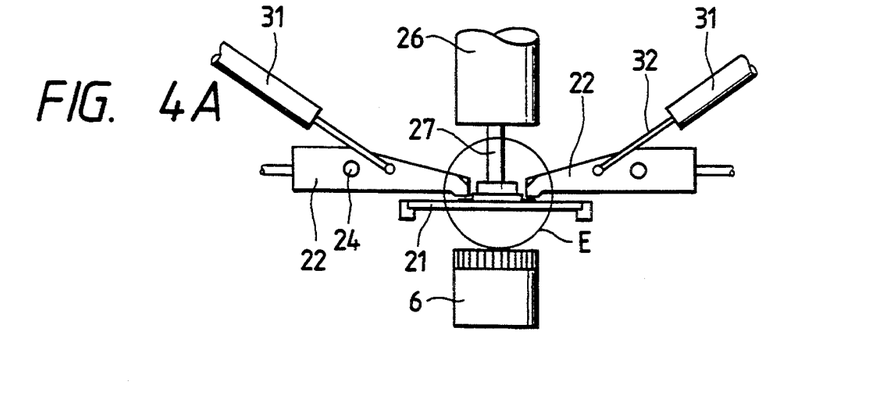
FIG. 4A is a view similar to FIG. 3, but showing the lighting unit disposed in a working position.

Referring back to FIG. 1, there is shown a lighting unit including a pair of flat, plate-like light projectors 22 held in confrontation with a space t therebetween. The space or distance t between the opposed front edges of the light projectors 22 are larger than the width of a semiconductor chip C for a reason described below. A front end portion of each of the light projectors 22 is connected to a forward end of a piston rod 32 of a second cylinder actuator 31. The rear end of the light projector 22 is pivoted by a horizontal fixed pin 24 so that the light projector 22 is pivotally movable about the horizontal fixed pin 24. As shown in FIG. 3, the rear end of each of the second cylinder actuators 31 is hinged to a fixed vertical portion W of a frame of the observation system. A tension spring 33 has one end connected to the fixed vertical frame portion W, the opposite end being connected to a portion of each light projector 22 located between the horizontal fixed pin 24 and the forward end of the piston rod 32. The tension spring 33 thus connected urges the light projector 22 into an upright or vertical position shown in FIG. 3. When the second cylinder actuators 31, 31 are activated to extend their piston rods 32, 32, the light projectors 22, 22 pivot downward about the respective horizontal fixed pins 24, 24 and move from the vertical position of FIG. 3 to a horizontal position shown in FIG. 4.

Figure 4B:
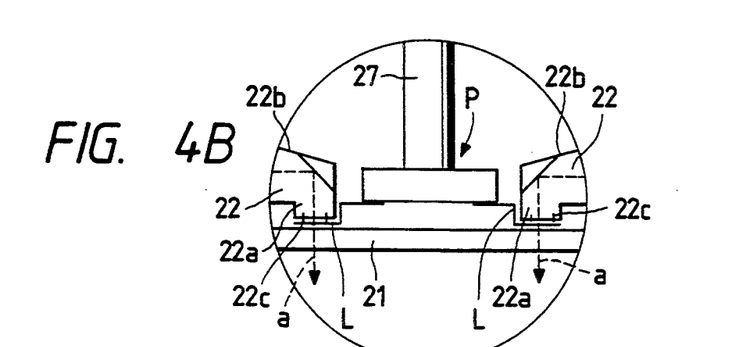
FIG. 4B is an enlarged view of a portion designated by E in FIG. 4A.

As shown in FIG. 1, each of the light projectors 22 is connected with a light source 35 via an optical-fiber 34. With this arrangement, light emitted from the light source 35 is transmitted through the optical-fiber 34 to the light projector 22. The light projector 22 has an internal light path (partly indicated by broken lines designated by reference character "a" in FIGS. 4b and 5D) coated with a light shielding or screening material. As shown in FIGS. 3 and 4B, the light projector 22 includes a presser portion 22a formed on the under surface of the light projector 22 along a front edge 22b (FIG. 4B) thereof. When the light projectors 22, 22 are disposed in the horizontal position shown in FIG. 4a the presser portions 22a, 22a face vertically downward and confront with the upper surface of the platform 21. As shown in FIG. 4B, the light path a in each of the light projectors 22 has an open end 22c from which a beam of light is projected onto the outer leads L of the semiconductor device P. The presser portion 22a extends around the open end 22c of the light path a.

A loading stage 28 shown in FIG. 1 is disposed on one side of the landing stage 20 opposite the first cylinder actuator 14 for receiving a semiconductor device P including a semiconductor chip C. The loading stage 28 lies in the same horizontal plane as the landing stage 21. One side of the loading stage 28 is connected to a forward end of a piston rod 41 of a third cylinder actuator 40 extending in the X direction. In response to reciprocating movement of the piston rod 41, the loading stage 28 is movable between an advanced position in which the semiconductor device P carried on the loading stage 28 is located directly above the camera 6, and a retracted position remote from the advanced position. The loading stage 28 is normally disposed in the retracted position.

As shown in FIG. 1, a transfer head 26 is offset in the Y direction from the one side of the landing stage 21. The transfer head 26 is mounted on a second X-Y table 29 and includes a vacuum nozzle 27 extending vertically downward from a lower end of the transfer head 26. The vacuum nozzle 27 is operatively connected with a drive motor 26a mounted in the transfer head 26. When the drive motor 26a is energized, the vacuum nozzle 27 turns about its longitudinal axis extending vertically (the direction of angular movement of the vacuum nozzle 27 is referred to as 8 direction). The second X-Y table 29 is composed of an X-table 29a and a Y-table 29b and is movable in a horizontal direction in the same manner as the first X-Y table 1. The second X-Y table 29 is also movable in a vertical direction. The vacuum nozzle 27 has a suction hole (not shown) connected with a vacuum source such as a suction pump (not shown). A packaging table 103 is disposed on one side (left side in FIG. 1) of the second X-Y table 29.

The electronic component observation system of the foregoing construction operates as follows.

Operation of the observation system begins with parts in the following conditions. The piston rod 15 of the first cylinder actuator 14 is fully retracted and, hence, the landing stage 20 is disposed in the retracted position which is horizontally spaced far away from the camera 6. The piston rods 32 of the respective second cylinder actuators 31 are retracted to keep the corresponding light projectors 22 in the vertical position shown in FIG. 3. The piston rod 41 of the third cylinder actuator 40 is also retracted so that the loading stage 28 is disposed in the retracted position which is horizontally spaced far away from the camera 6. The transfer head 26 is moved in the Y direction until the vacuum nozzle 27 is directly above the camera 6.

A semiconductor device P including a semiconductor chip C and outer leads L projecting from four sides of the semiconductor device P is supplied onto the loading stage 28, and then the third cylinder actuator 40 is activated to extend its piston rod 41. With this movement of the piston rod 41, the loading stage 28 moves from the retracted position of FIG. 1 to the advanced position shown in FIG. 5A. In this advanced position, the loading stage 28 is disposed between the camera 6 and the vacuum nozzle 27, with the semiconductor device P vertically aligned with the camera 6 and the vacuum nozzle 27.

Figure 5A:
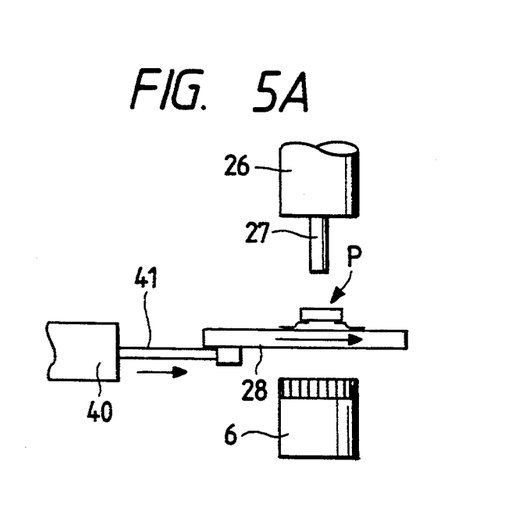
FIGS. 5A through 5F are diagrammatical views illustrative of the operation of the electronic component observation system.
Figure 5B:
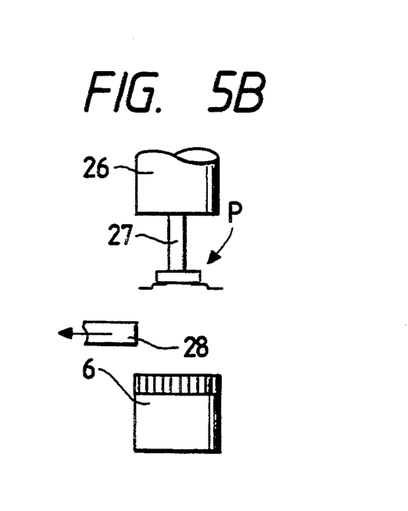

Then, the transfer head 26 moves downward to hold the semiconductor device P by the vacuum nozzle 27 and subsequently moves upward to pick up the semiconductor device P from the loading stage 28, as shown in FIG. 5B. The third cylinder actuator 40 (FIG. 1) is activated again to retract its piston rod 41, thereby retracting the loading stage 28 from the position located above the camera 6.

Figure 5C:
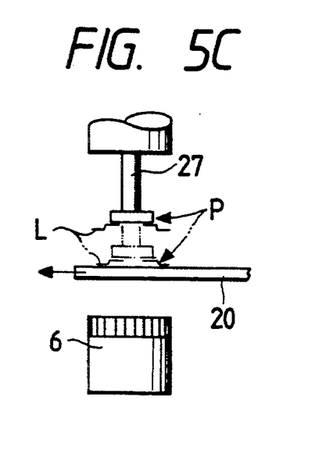
Figure 5D:
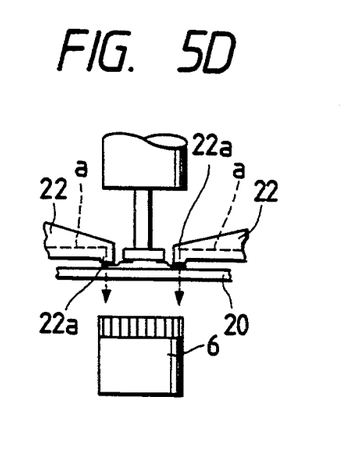

Thereafter, the first cylinder actuator 14 is activated to extend its piston rod 15, thereby moving the landing stage 21 into the advanced position shown in FIG. 5C where the platform 21 (FIGS. 1 and 2) is vertically aligned with the semiconductor device P and the camera 6. Then, the transfer head 26 is lowered again to place outer leads L of the semiconductor device P onto the platform 21 of the landing stage 20. In this condition, the shape of the outer leads L are corrected when they have been deformed, and a correct arrangement and position of the outer leads L can be detected by the camera 6.

Then, the second cylinder actuators 31 (FIG. 3) are activated to extend their piston rods 32, thereby turning the light projectors 22 downwardly about the horizontal fixed pins 24 against the force of the tension springs 33. When the light projectors 22 are disposed in the horizontal position shown in FIGS. 4A, 4B and 5D, the presser portions 22a force the outer leads L downward against the platform 21. In this instance, the opposed front edges of the light projectors 22 are spaced by the distance t (FIG. 1) which is larger than the width of the semiconductor chip C, so that the outer leads L can be adequately depressed against the platform 21 by means of the presser portions 22a without the occurrence of interference between the light projectors and the semiconductor chip C. Thus, the outer leads L are forced into a correct shape and configuration.

While keeping this condition, the light sources 35 are switched on whereupon beams of light are transmitted, in an adequate amount, from the light sources 35 to the light projectors 22 through the optical fiber cables 34. The light beams are then projected from the open ends 22c (Fig. 4B) of the respective light projectors 22 onto the outer leads L. Under such illuminated condition, the first X-Y table 1 (FIG. 1) is horizontally moved in the X and Y directions and, while at the same time, the outer leads L projecting from the four sides of the semiconductor device P are observed from the underside of the transparent platform 21 of the landing stage 20 by means of the camera 6. In this instance, since a deformation of the outer leads L has already been removed or eliminated as described above, the arrangement and position of the outer leads L can be observed accurately. In addition, the platform 21 is on a level with a substrate 101 carried on the packaging table 103, so that observation of the semiconductor device P using the camera 6 can be achieved under the same conditions as established when the semiconductor device P is mounted on the substrate 101 on the packaging table 103.

Figure 5E:
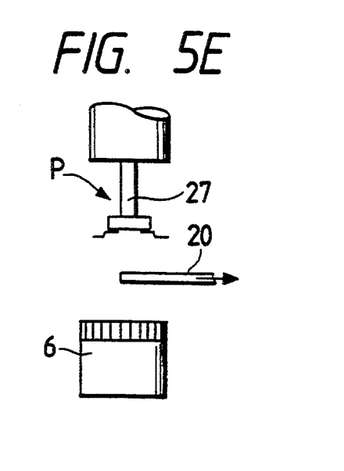
Figure 5F:
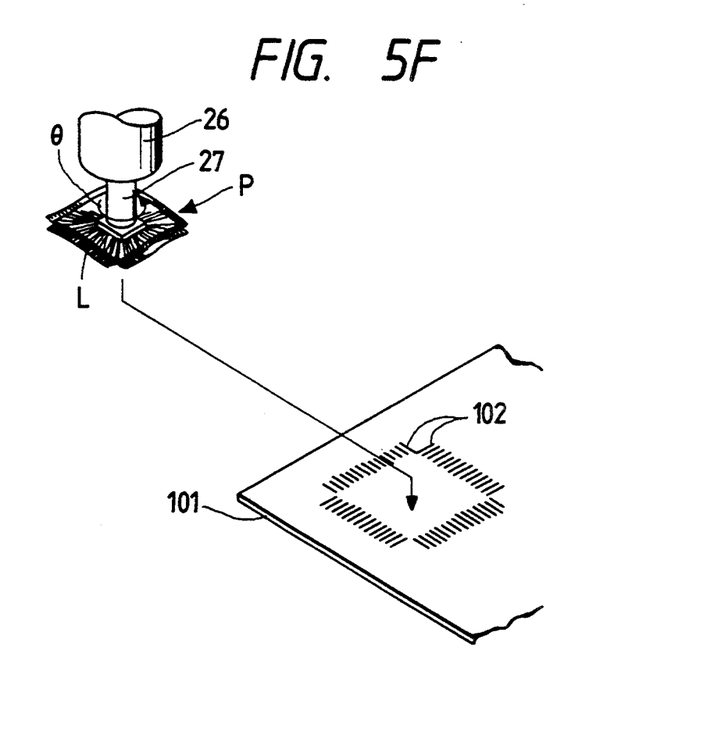

Then, the second cylinder actuators 31 are activated to retract their piston rods 32 whereupon the light projectors 22 pivot upwardly away from the platform 21 under the force of the tension springs 33. Thus, the light projectors 22 are brought into the upright position shown in FIG. 3. Subsequently, the transfer head 26 moves upwardly until the semiconductor device P held by the vacuum nozzle 27 is spaced from the platform 21 by a predetermined distance. The second cylinder actuator 14 is activated to retract its piston rod 15, thereby retracting the landing stage 20 from the position above the camera 6, as shown in FIG. 5E.

Thereafter, the second X-Y table 29 is displaced adequately to move the transfer head 26 above the substrate 101 carried on the packaging table 103. Subsequently, the transfer head 26 is lowered for setting the semiconductor device P onto electrodes 102 formed on the substrates 101. In this instance, the vacuum source is de-energized to release the semiconductor device P from the vacuum nozzle 27. When a positional deviation in either of the X, Y and θ directions of the semiconductor device P is detected by the camera 6, such deviation must be corrected before the semiconductor device P is mounted on the substrate 101. The deviation in the X and Y directions can be compensated for by adjusting the stroke of the transfer head 26 in the X and Y directions by properly driving the X-Y table 29. The deviation in the θ direction can be compensated for by turning the vacuum nozzle 27 in the e direction. Thus, the semiconductor device P can be accurately aligned with the substrate 101 when the semiconductor device P is mounted on the substrate 101.

The loading stage 28 may be omitted in which instance a semiconductor device P is picked up by the vacuum nozzle 27 of the transfer head 26 and then placed onto the platform 21 of the landing stage 20 where it is observed by the camera 6. Depending on the type of the semiconductor devices, it may occurs that a deformed outer lead L is shaped into a correct form when the semiconductor device P is placed onto the platform 21. When used with the semiconductor devices of this type, the presser portions 22a of the light projectors 22 may be omitted. In this case, however, observation of the outer leads of the semiconductor device is achieved by using the camera 6 while illuminating the outer leads with light emitted from the end openings 22c of the light projectors 22. The transfer head 26 may be movable only in a vertical direction in order to improve positioning accuracy, in which instance movement of the electronic device P is effected by horizontally movable stages including the stages 28, 20.

Obviously, various minor changes and modifications of the present invention are possible in the light of the above teaching. It is therefore to be understood that within the scope of the appended claims the invention may be practiced otherwise than as specifically described.

What is claimed is:

1. An electronic component observation system for observing an electronic component having a plurality of outer leads projecting from a body of the electronic component and formed on a flexible film carrier, comprising:

a stage for supporting thereon the electronic component;

a movable transfer head;

drive means for moving said transfer head;

a vacuum nozzle associated with said transfer head for releasably holding thereon the electronic component by a suction force, said transfer head being movable by said drive means, with the electronic component held by said vacuum nozzle, to force the film carrier of the electronic component against said stage to temporarily correct the shape and configuration of the outer leads which have been deformed due to curl of the film carrier;

an observation unit for observing the outer leads of the electronic components to detect an arrangement and position of the outer leads while the shape and configuration of the outer leads is temporarily corrected by forcing the film carrier against said stage;

a lighting unit for illuminating the outer leads of the electronic components with a beam of light while the film carrier is forced against said stage; and wherein said lighting unit is composed of a pair of light projectors pivotally movable about a pair of horizontal axes, respectively, each of said light projectors having an internal light path having an open end from which said light beam is projected, and a presser portion extending around said open end of said internal light path, said presser portion, in response to pivotal movement of each of said light projectors, being engageable with a portion of the outer leads to force the film carrier against said stage.

2. An electronic component observation system for observing an electronic component having a plurality of outer leads projecting from a body of the electronic component and formed on a flexible film carrier, comprising:

a stage for supporting thereon the electronic component;

a movable transfer head;

drive means for moving said transfer head;

a vacuum nozzle associated with said transfer head for releasable holding thereon the electronic component by a suction force, said transfer head being movable by said drive means, with the electronic component held by said vacuum nozzle to force the film carrier of the electronic component against said stage to temporarily correct the shape and configuration of the outer leads which have been deformed due to curl of the film carrier;

an observation unit for observing the outer leads of the electronic components to detect an arrangement and position of the outer leads while the shape and configuration of the outer leads is temporarily corrected by forcing the film carrier against said stage;

a lighting unit for illuminating the outer leads of the electronic components with a beam of light while the film carrier is forced against said stage;

a static eliminator for removing static electricity from said stage; and wherein said lighting unit is composed of a pair of light projectors pivotally movable about a pair of horizontal axes, respectively, each of said light projectors having an internal light path having an open end from which said light beam is projected, and a presser portion extending around said open end of said internal light path, said presser portion, in response to pivotal movement of each of said light projectors, being engageable with a portion of the outer leads to force the film carrier against said stage.

3. An electronic component observation system for observing an electronic component having a plurality of outer leads projecting from a body of the electronic component and formed on a flexible film carrier, comprising:

a stage for supporting thereon the electronic component;

a movable transfer head;

drive means for moving said transfer head;

a vacuum nozzle associated with said transfer head for releasably holding thereon the electronic component by a suction force, said transfer head being movable by said drive means, with the electronic component held by said vacuum nozzle, to force the film carrier of the electronic component against said stage to temporarily correct the shape and configuration of the outer leads which have been deformed due to curl of the film carrier;

an observation unit for observing the outer leads of the electronic components to detect an arrangement and position of the outer leads while the shape and configuration of the outer leads is temporarily corrected by forcing the film carrier against said stage;

a lighting unit for illuminating the outer leads of the electronic components with a beam of light while the film carrier is forced against said stage;

wherein said stage is transparent, said lighting unit comprises at least one light projector projecting said light beam onto the outer leads of the electronic component from an upper side of the outer leads, and said observation unit is a camera observing the outer leads from the underside of said transparent stage; and wherein said lighting unit is composed of a pair of light projectors pivotally movable about a pair of horizontal axes, respectively, each of said light projectors having an internal light path having an open end from which said light beam is projected, and a presser portion extending around said open end of said internal light path, said presser portion, in response to pivotal movement of each of said light projectors, being engageable with a portion of the outer leads to force the film carrier against said stage.

4. An electronic component observation system for observing an electronic component having a plurality of outer leads projecting from a body of the electronic component and formed on a flexible film carrier, comprising:

a stage for supporting thereon the electronic component;

a movable transfer head;

drive means for moving said transfer head;

a vacuum nozzle associated with said transfer head for releasably holding thereon the electronic component by a suction force, said transfer head being movable by said drive means, with the electronic component held by said vacuum nozzle to force the film carrier of the electronic component against said stage to temporarily correct the shape and configuration of the outer leads which have been deformed due to curl of the film carrier;

an observation unit for observing the outer leads of the electronic components to detect an arrangement and position of the outer leads while the shape and configuration of the outer leads is temporarily corrected by forcing the film carrier against said stage;

a lighting unit for illuminating the outer leads of the electronic components with a beam of light while the film carrier is forced against said stage;

a static eliminator for removing static electricity from said stage;

wherein said stage is transparent, said lighting unit comprises at least one light projector projecting said light beam onto the outer leads of the electronic component from an upper side of the outer leads, and said observation unit is a camera observing the outer leads from the underside of said transparent stage; and wherein said lighting unit is composed of a pair of light projectors pivotally movable about a pair of horizontal axes, respectively, each of said light projectors having an internal light path having an open end from which said light beam is projected, and a presser portion extending around said open end of said internal light path, said presser portion, in response to pivotal movement of each of said light projectors, being engageable with a portion of the outer leads to force the film carrier against said stage.

5. An electronic component observation system for observing an electronic component having a plurality of outer leads projecting from a body of the electronic component and formed on a normally curled flexible film carrier, comprising:

a stage for supporting thereon the electronic component;

a movable transfer head;

drive means for moving the transfer head;

a vacuum nozzle associated with the transfer head for releasably holding thereon the electronic component by a suction force, the transfer head being movable by the drive means, with the electronic component held by the vacuum nozzle, to position the film carrier, remaining curled, against the stage;

a lighting unit movable to a position spaced from the component for illuminating the outer leads of the electronic components with a beam of light, the lighting unit having projections for pressing the film carrier against the stage to flatten the film carrier and the carried electrodes against the stage while the leads are illuminated; and an observation unit for observing the outer leads of the electronic component to detect an arrangement and position of the outer leads while they are illuminated and flattened against the stage.

6. An electronic component observation system according to claim 5, wherein said stage is transparent, said lighting unit comprises at least one light projector projecting said light beam onto the outer leads of the electronic component from an upper side of the outer leads, and said observation unit is a camera observing the outer leads from the underside of said transparent stage.

7. An electronic component observation system according to claim 5, wherein said transfer head is movable in a vertical direction, said stage is movable in a horizontal direction, and said observation unit is movable in horizontal and vertical directions.

8. An electronic component observation system according to claim 7, wherein said transfer head is also movable in a horizontal direction.

9. An electronic component observation system according to claim 7, further including an X-Y table, said observation unit being mounted on said X-Y table.

10. An electronic component observation system according to claim 5, wherein said lighting unit comprises at least one light projector, a light source, and an optical fiber interconnecting said light source and said light projector.

11. An electronic component observation system for observing an electronic component having a plurality of outer leads projecting from a body of the electronic component and formed on a normally curled flexible film carrier, comprising:

a stage for supporting thereon the electronic component;

a movable transfer head;

drive means for moving the transfer head;

a vacuum nozzle associated with the transfer head for releasably holding thereon the electronic component by a suction force, the transfer head being movable by the drive means, with the electronic component held by the vacuum nozzle, to position the film carrier, remaining curled, against the stage;

a lighting unit movable to a position spaced from the component for illuminating the outer leads of the electronic components with a beam of light, the lighting unit having projections for pressing the film carrier against the stage to flatten the film carrier and the carried electrodes against the stage while the leads are illuminated;

an observation unit for observing the outer leads of the electronic components to detect an arrangement and position of the outer leads while they are illuminated and flattened against the stage; and a static eliminator for removing static electricity from the stage.

12. An electronic component observation system according to claim 11, wherein said stage is transparent, said lighting unit comprises at least one light projector projecting said light beam onto the outer leads of the electronic component from an upper side of the outer leads, and said observation unit is a camera observing the outer leads from the underside of said transparent stage.

13. An electronic component observation system according to claim 11, wherein said transfer head is movable in a vertical direction, said stage is movable in a horizontal direction, and said observation unit is movable in horizontal and vertical directions.

14. An electronic component observation system according to claim 13, wherein said transfer head is movable also in a horizontal direction.

15. An electronic component observation system according to claim 13, further including an X-Y table, said observation unit being mounted on said X-Y table.

16. An electronic component observation system according to claim 11, wherein said lighting unit comprises at least one light projector, a light source, and an optical fiber interconnecting said light source and said light projector.

17. An electronic component observation system according to claim 11, wherein said static eliminator comprises an ion source for producing gas ions, a tube, and at least one spout connected by said tube to said ion source and disposed adjacent to said stage for emitting the gas ions onto said stage.

* * * * *